US011515372B2

(12) United States Patent
Yug

(10) Patent No.: US 11,515,372 B2
(45) Date of Patent: Nov. 29, 2022

(54) METHOD OF MANUFACTURING ELECTRONIC APPARATUS

(71) Applicant: Samsung Display Co., Ltd., Yongin-si (KR)

(72) Inventor: Geunwoo Yug, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 92 days.

(21) Appl. No.: 17/095,671

(22) Filed: Nov. 11, 2020

(65) Prior Publication Data

US 2021/0249484 A1  Aug. 12, 2021

(30) Foreign Application Priority Data

Feb. 10, 2020 (KR) .................. 10-2020-0015808

(51) Int. Cl.
*H01L 27/32* (2006.01)
*H01L 51/56* (2006.01)
*H01L 51/00* (2006.01)

(52) U.S. Cl.
CPC .......... *H01L 27/3234* (2013.01); *H01L 27/32* (2013.01); *H01L 27/3244* (2013.01); *H01L 51/0097* (2013.01); *H01L 51/56* (2013.01); *H01L 2227/323* (2013.01); *H01L 2251/5338* (2013.01)

(58) Field of Classification Search
None
See application file for complete search history.

(56) References Cited

U.S. PATENT DOCUMENTS

| 9,360,691 | B2 | 6/2016 | Jeong |
| 10,466,822 | B2 | 11/2019 | Kim et al. |
| 10,644,087 | B2 | 5/2020 | Lee et al. |
| 2018/0147810 | A1 | 5/2018 | Cheon |
| 2020/0075692 | A1* | 3/2020 | Park .................... H01L 27/3244 |
| 2020/0324375 | A1* | 10/2020 | Oh ........................ B23K 26/382 |
| 2021/0098750 | A1* | 4/2021 | Yug .................... B23K 26/0876 |

FOREIGN PATENT DOCUMENTS

| KR | 10-2014-0064366 | 5/2014 |
| KR | 10-2015-0100970 | 9/2015 |
| KR | 10-2018-0061532 | 6/2018 |
| KR | 10-2018-0063633 | 6/2018 |
| KR | 10-2019-0096467 | 8/2019 |
| KR | 10-2020-0120794 | 10/2020 |

\* cited by examiner

*Primary Examiner* — J. E. Schoenholtz
(74) *Attorney, Agent, or Firm* — H.C. Park & Associates, PLC

(57) ABSTRACT

A method includes: providing an unfinished set module for a display panel having an active area and a peripheral area adjacent to the active area and being foldable about a foldable axis extending in one direction, the active area including a hole formation area; selectively irradiating a laser beam along a path defined along a boundary between the hole formation area and the active area, the path including first paths spaced apart from each other in a direction substantially parallel to the foldable axis and second paths disposed between the first paths, at a first energy density and at second energy density different from the first energy density, wherein the laser beam is irradiated at the first energy density along the first paths and at the second energy density along the second paths; and forming a set module having a hole by removing the hole formation area from the unfinished set module.

20 Claims, 12 Drawing Sheets

METHOD OF MANUFACTURING ELECTRONIC APPARATUS

CROSS-REFERENCE TO RELATED APPLICATION

This application claims priority from and the benefit of Korean Patent Application No. 10-2020-0015808, filed on Feb. 10, 2020, which is hereby incorporated by reference for all purposes as if fully set forth herein.

BACKGROUND

Field

Exemplary embodiments of the invention relate to a method of manufacturing an electronic apparatus, more particularly, to a method of manufacturing an electronic apparatus including an electronic module having a display device.

Discussion of the Background

An electronic apparatus is activated in response to electrical signals applied thereto. The electronic apparatus includes a display unit that displays an image or a sensing unit that senses an external input. An organic light emitting display panel included in the display unit has advantageous properties, such as low power consumption, high brightness, and fast response speed.

The electronic apparatus includes an electronic module that receives an external signal or outputs an output signal externally. The electronic module is accommodated in an external case together with a display panel to form the electronic apparatus.

The above information disclosed in this Background section is only for understanding of the background of the inventive concepts, and, therefore, it may contain information that does not constitute prior art.

SUMMARY

Methods of manufacturing an electronic apparatus according to the principles and exemplary implementations of the invention are capable of forming an electronic module, such as a camera module for foldable display panel, having improved durability. For example, the areas of the foldable display panel having different applied stresses due to repeated folding operations are made differently from each other, and the energy density of the laser beam used to remove a hole formation area is different according to the targeted area, and thus, components disposed in areas receiving relatively greater stresses are protected.

Additional features of the inventive concepts will be set forth in the description which follows, and in part will be apparent from the description, or may be learned by practice of the inventive concepts.

According to one aspect of the invention, a method of manufacturing an electronic apparatus includes the steps of: providing an unfinished set module for a display panel having an active area and a peripheral area adjacent to the active area and being foldable about a foldable axis extending in one direction, the active area including a hole formation area; selectively irradiating a laser beam along a path defined along a boundary between the hole formation area and the active area, the path including first paths spaced apart from each other in a direction substantially parallel to the foldable axis and second paths disposed between the first paths, at a first energy density and at second energy density different from the first energy density, wherein the laser beam is irradiated at the first energy density along the first paths and at the second energy density along the second paths; and forming a set module having a hole by removing the hole formation area from the unfinished set module.

The first energy density may be less than the second energy density.

The hole formation area may have a generally circular shape, a generally oval shape, or a generally polygonal shape.

The laser beam may be rotated along the path including a moving path in a range of about one time or more and about hundred times or less.

The hole formation area may be provided in plural.

The laser beam may be generated by a pulse laser.

The step of selectively irradiating a laser beam may include moving the laser beam along the first paths at a first speed slower than a speed at which the laser beam may be moved along the second paths.

The laser beam may move in a range between about 50 mm/s or greater and about 6,000 mm/s or less.

The laser beam may have a power in a range between about 0.5 W or greater and about 30 W or less.

The laser beam may have a frequency in a range about 100 kHz or greater and about 20,000 kHz or less.

According to another aspect of the invention, a method of manufacturing an electronic apparatus includes: providing an unfinished set module for a display panel having an active area and a peripheral area adjacent to the active area and being foldable about a foldable axis extending in one direction, the active area including first areas and second areas that are subject to different stresses during folding; irradiating a laser beam to the active area; and forming a set module in which a module hole is defined through the unfinished set module by irradiating to the first areas a laser beam at a first energy density and irradiating a laser beam to the second areas at a second energy density greater than the first energy density.

The first areas may be spaced apart from each other in a direction substantially parallel to the foldable axis and the second areas may be disposed between the first areas.

The laser beam may have a generally circular shape, a generally oval shape, or a generally polygonal shape.

The laser beam may be rotated along the path in a range of about one time or more and about one hundred times or less.

The module hole may be provided in plural.

The laser beam may be generated by a pulse laser.

The step of forming the set module may include moving the laser beam along the first paths at a first speed slower than a speed at which the laser beam may be moved along the second paths.

The laser beam may move in a range between about 50 mm/s or greater and about 6,000 mm/s or less.

The laser beam may have a power in a range about 0.5 W or greater and about 30 W or less.

The laser beam may have a frequency in a range about 100 kHz or greater and about 20,000 kHz or less.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
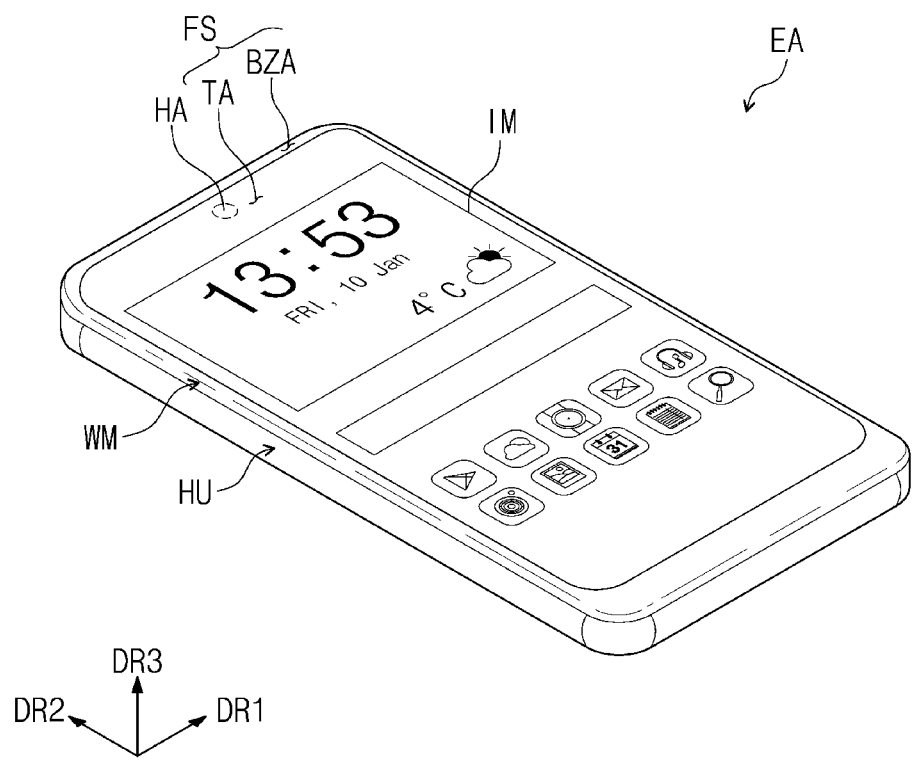
FIG. 1 is an assembled perspective view illustrating an exemplary embodiment of an electronic apparatus constructed according to principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements components, regions, layers and/or sections, these elements, components, regions, layers and/or sections, these elements, components, regions, layers and/or sections, these elements, components, regions, layers and/or sections should not be limited by these terms. These terms are used to distinguish one element, component, region, layer or section from another element component, region, layer or section. Thus, a first element component, region, layer or section discussed below could be termed a second element component, region, layer or section without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2A:
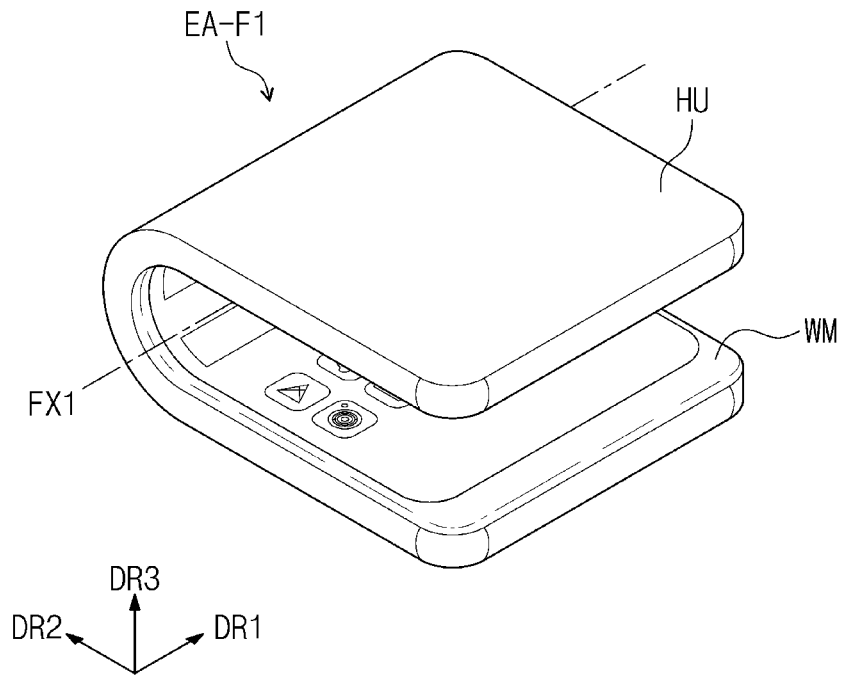
FIGS. 2A and 2B are perspective views illustrating different folding positions of the exemplary electronic apparatus shown in FIG. 1.
Figure 2B:
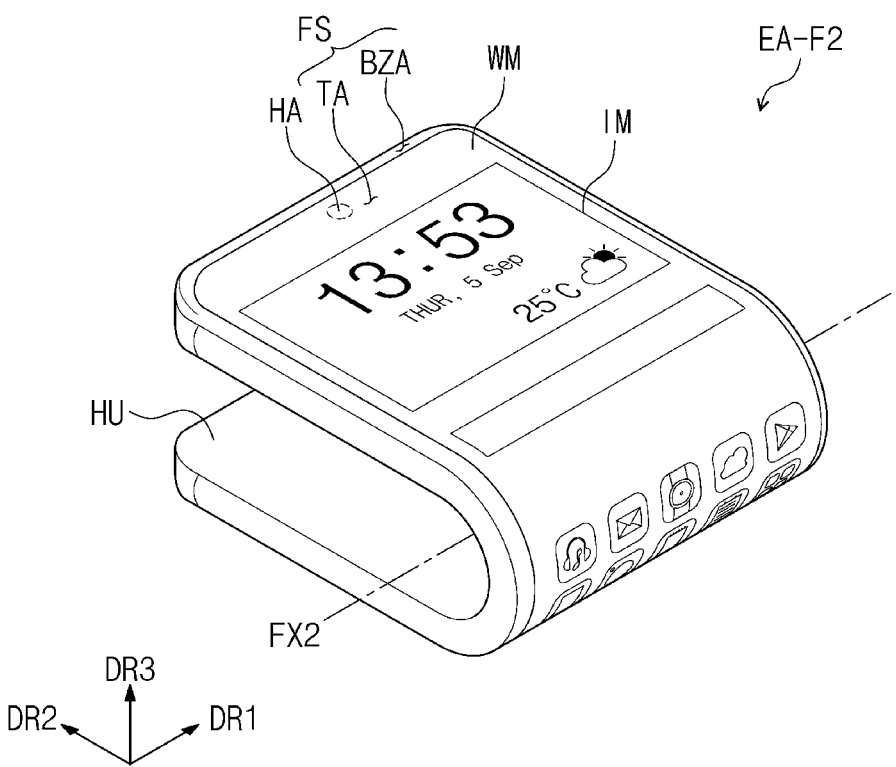

FIG. 1 is an assembled perspective view illustrating an exemplary embodiment of an electronic apparatus constructed according to principles of the invention. FIGS. 2A and 2B are perspective views illustrating different folding positions of the exemplary electronic apparatus shown in FIG. 1.

FIG. 2A shows a perspective view of the electronic apparatus EA shown in FIG. 1 in a first folded position, and FIG. 2B shows a perspective view of the electronic apparatus EA shown in FIG. 1 in a second folded position. Hereinafter, some exemplary embodiments will be described with reference to FIGS. 1 to 2B.

The electronic apparatus EA may be an apparatus that is activated in response to electrical signals applied thereto. The electronic apparatus EA may be applied to various exemplary embodiments. For example, the electronic apparatus EA may be a tablet computer, a notebook computer, a computer, or a smart television. In the some exemplary embodiments, a smartphone will be described as a representative example of the electronic apparatus EA.

The electronic apparatus EA displays an image IM through a transmission area TA. The image IM includes at least one of a still image and a motion image. FIG. 1 shows a clock widget and application icons as a representative example of the image IM.

The transmission area TA may have a generally quadrangular shape substantially parallel to each of a first direction DR1 and a second direction DR2, however, this is merely exemplary. The transmission area TA may include various shapes and should not be particularly limited.

A bezel area BZA is defined adjacent to the transmission area TA. The bezel area BZA may surround the transmission area TA. However, this is merely exemplary, and the bezel area BZA may be defined adjacent to only one side of the transmission area TA or may be omitted. The electronic apparatus EA according to some exemplary embodiments may include various embodiments and should not be limited to a particular exemplary embodiment.

A hole area HA may be defined in the electronic apparatus EA according to some exemplary embodiments. The hole area HA may overlap an electronic module EM (refer to FIG. 3A), which will be described below. That is, the hole area HA may be the area where a camera or the like is disposed to photograph an external subject or the area where an optical sensor is disposed to sense a light. The image IM may be displayed while surrounding at least a portion of an edge of the hole area HA. In illustrated exemplary embodiments, the image IM may be displayed while surrounding the hole area HA. This will be described in detail below.

A normal line direction of a front surface FS may correspond to a thickness direction DR3 (hereinafter, referred to as a "third direction") of the electronic apparatus EA. In illustrated exemplary embodiments, front (or upper) and rear (or lower) surfaces of each member are defined with respect to a direction in which the image IM is displayed. The front and rear surfaces are opposite to each other in the third direction DR3.

Directions indicated by the first, second, and third directions DR1, DR2, and DR3 are relative to each other and may be changed to other directions.

The electronic apparatus EA may have an appearance defined by a window WM and an external case HU. The front surface FS of the electronic apparatus EA may be defined in the window WM.

Referring to FIGS. 2A and 2B, the electronic apparatus EA may be folded with respect to predetermined folding axes FX1 and FX2. As shown in FIG. 2A, an electronic apparatus EA-F1 may be folded with respect to a first folding axis FX1. The first folding axis FX1 may be defined on the window WM. Accordingly, the electronic apparatus EA-F1 may be folded such that different portions of the window WM face each other and the external case HU is exposed to the outside in the first mode.

As shown in FIG. 2B, an electronic apparatus EA-F2 may be folded with respect to a second folding axis FX2. The second folding axis FX2 may be defined on the external case HU. Therefore, the electronic apparatus EA-F2 may be folded such that different portions of the external case HU face each other and the window WM is exposed to the outside in the second mode. The image displayed by the electronic apparatus EA-F2 may be easily viewed by a user even though the electronic apparatus EA-F2 is in the folding state.

The first folding axis FX1 and the second folding axis FX2 may be substantially simultaneously present in the electronic apparatus EA. In this case, the electronic apparatus EA may be changed to the electronic apparatus EA-F1 of the first mode or the electronic apparatus EA-F2 of the second mode depending on a direction of an external force applied thereto. In other words, the first folding axis FX1 and the second folding axis FX2 may be selectively present in the electronic apparatus EA. The extension direction of the first folding axis FX1 and the second folding axis FX2 may be defined in various directions without being limited to the first direction DR1 and should not be limited to a particular exemplary embodiment.

Figure 3A:
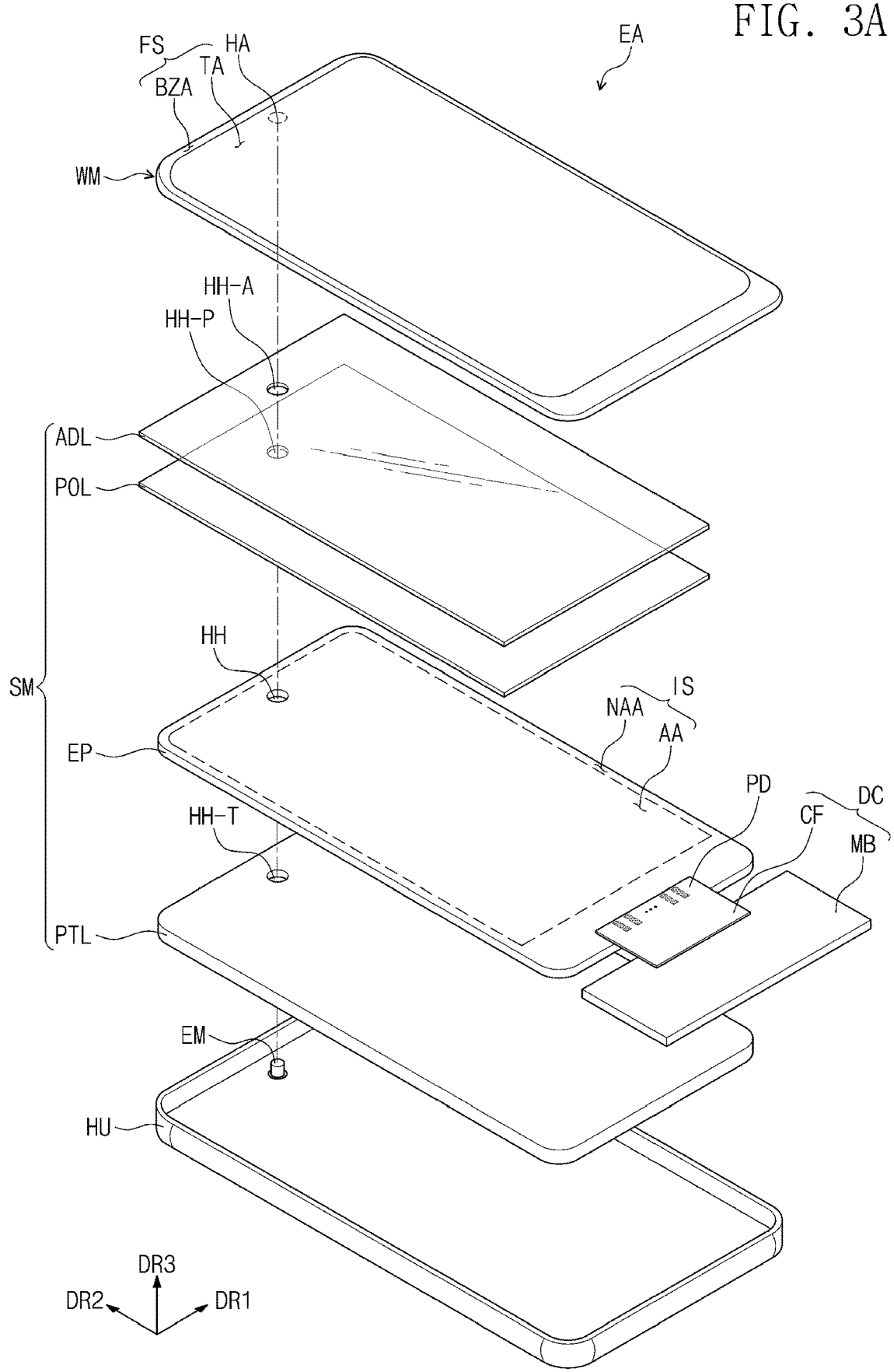
FIG. 3A is an exploded perspective view illustrating the exemplary electronic apparatus shown in FIG. 1.
Figure 3B:
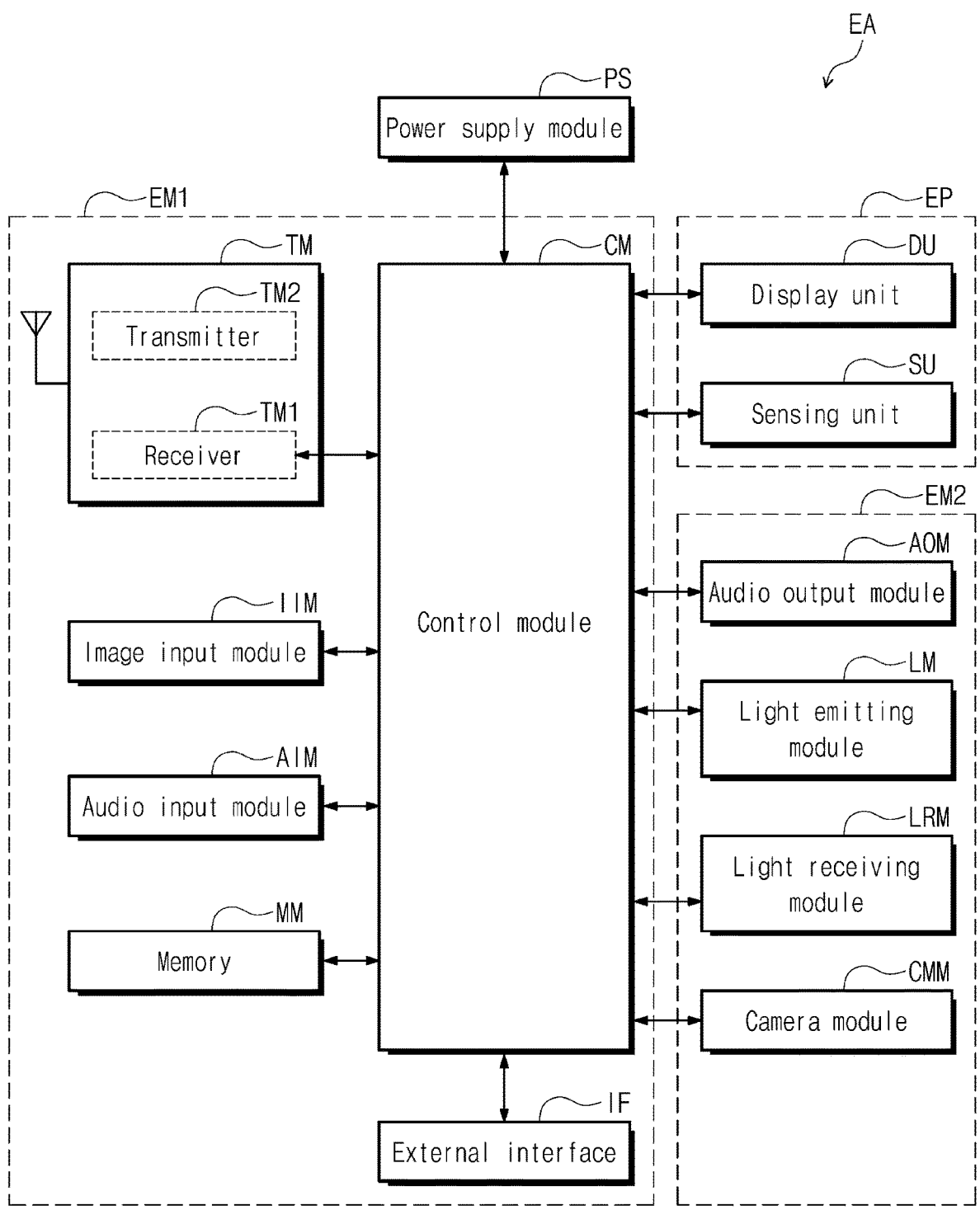
FIG. 3B is a block diagram illustrating the exemplary electronic apparatus shown in FIG. 3A.

FIG. 3A is an exploded perspective view illustrating the exemplary electronic apparatus shown in FIG. 1. FIG. 3B is a block diagram illustrating the exemplary electronic apparatus shown in FIG. 3A. Hereinafter, the electronic apparatus EA will be described with reference to FIGS. 3A and 3B.

Referring to FIG. 3A, the electronic apparatus EA may include the window WM, a set module SM, the electronic module EM, and the external case HU.

In illustrated exemplary embodiments, the set module SM may include an electronic panel EP, an optical film POL, an adhesive layer ADL, a circuit board DC, and a protective layer PTL. As described above, the window WM and the external case HU are attached to each other to define the appearance of the electronic apparatus EA.

The window WM may be disposed on the electronic panel EP and may cover a front surface IS of the electronic panel EP. The window WM may include an optically transparent insulating material. In addition, the window WM may have flexibility. For example, the window WM may include a resin film of a polyimide, a resin substrate, or a thin glass substrate.

The window WM may have a single-layer or multi-layer structure. For example, the window WM may have a stacked structure in which a plurality of plastic films is attached to each other by an adhesive or may have a stacked structure in which a glass substrate and a plastic film are attached to each other by an adhesive.

The window WM may include the front surface FS exposed to the outside. The front surface FS of the electronic apparatus EA may be defined by the front surface FS of the window WM. In detail, the transmission area TA may be an optically transparent area. The transmission area TA may have a shape corresponding to an active area AA. For example, the transmission area TA may overlap an entire portion or at least a portion of the active area AA. The image IM displayed through the active area AA of the electronic panel EP may be viewed from the outside through the transmission area TA.

The bezel area BZA may be an area that has a relatively low light transmittance compared with the transmission area TA. The bezel area BZA may define the shape of the transmission area TA. The bezel area BZA may be defined adjacent to the transmission area TA and may surround the transmission area TA.

The bezel area BZA may have a predetermined color. When the window WM is a glass or plastic substrate, the bezel area BZA may be a colored layer that is printed or deposited on a surface of the glass or plastic substrate. In other words, the bezel area BZA may be formed by coloring the corresponding area of the glass or plastic substrate.

The bezel area BZA may cover a peripheral area NAA of the electronic panel EP to prevent the peripheral area NAA from being viewed from the outside, however, this is merely exemplary. The bezel area BZA may be omitted from the window WM according to some exemplary embodiments.

The electronic panel EP may display the image IM. The electronic panel EP may include the front surface IS in which the active area AA and the peripheral area NAA are defined. The active area AA may be the area activated in response to electrical signals.

In illustrated exemplary embodiments, the active area AA may be the area through which the image IM is displayed. The transmission area TA may overlap at least the active area AA. For example, the transmission area TA may overlap the entire portion or at least a portion of the active area AA. Accordingly, the user may view the image IM through the transmission area TA.

The peripheral area NAA may be covered by the bezel area BZA. The peripheral area NAA may be defined adjacent to the active area AA. The peripheral area NAA may surround the active area AA. A driving circuit or a driving line may be arranged in the peripheral area NAA to drive the active area AA.

Various signal lines, pads PD, or electronic elements may be disposed in the peripheral area NAA to apply electrical signals to the active area AA. The peripheral area NAA may be covered by the bezel area BZA, and thus, the peripheral area NAA may not be viewed from the outside.

In illustrated exemplary embodiments, the electronic panel EP may be assembled in a generally flat state such that the active area AA and the peripheral area NAA face the window WM, however, this is merely exemplary. That is, a portion of the peripheral area NAA of the electronic panel EP may be generally curved. In this case, the portion of the peripheral area NAA may be toward a rear surface of the electronic apparatus EA, and thus, the bezel area BZA in the front surface of the electronic apparatus EA may be reduced. In other words, the electronic panel EP may be assembled to allow a portion of the active area AA to be curved. Further, the peripheral area NAA may be omitted from the electronic panel EP according to some exemplary embodiments.

A panel hole HH may be defined through the electronic panel EP. At least a portion of the panel hole HH may be surrounded by the active area AA. In illustrated exemplary embodiments, the panel hole HH may be spaced apart from the peripheral area NAA. The panel hole HH may be defined in the active area AA such that an edge thereof is entirely surrounded by the active area AA. In the assembled state of the electronic apparatus EA according to illustrated exemplary embodiments, the panel hole HH may be formed at a position that overlaps the transmission area TA and is spaced apart from the bezel area BZA.

The circuit board DC may be connected to the electronic panel EP. The circuit board DC may include a flexible board CF and a main board MB. The flexible board CF may include an insulating film and conductive lines mounted on the insulating film. The conductive lines may be connected to the pads PD to electrically connect the circuit board DC and the electronic panel EP.

In illustrated exemplary embodiments, the flexible board CF may be assembled in a generally curved state. Accordingly, the main board MB may be disposed on a rear surface of the electronic panel EP and may be stably accommodated in a space provided by the external case HU. In some exemplary embodiments, the flexible board CF may be omitted, and in this case, the main board MB may be directly connected to the electronic panel EP.

The main board MB may include signal lines and electronic elements. The electronic elements may be connected to the signal lines and may be electrically connected to the electronic panel EP. The electronic elements may generate various electrical signals, e.g., a signal used to generate the image WI or a signal used to sense an external input, and may process sensed signals. The main board MB may be provided in plural to correspond to electrical signals generated and processed thereby, however, the exemplary embodiments are not so limited.

In the electronic apparatus EA according to some exemplary embodiments, the driving circuit applying the electrical signal to the active area AA may be mounted directly on the electronic panel EP. In illustrated exemplary embodiments, the driving circuit may be mounted in a chip form or may be formed together with pixels. In this case, an area of the circuit board DC may be reduced or the circuit board DC may be omitted. The electronic apparatus EA may include various exemplary embodiments, and it should not be limited to a specific exemplary embodiment.

The optical film POL may be disposed between the window WM and the electronic panel EP. The optical film POL may decrease the reflectance of external light incident thereto from the outside of the window WM with respect to the electronic panel EP. In illustrated exemplary embodiments, the optical film POL may include a polarization film or a color filter.

A predetermined hole HH-P (hereinafter, referred to as an "optical film hole") may be defined through the optical film POL. The optical film hole HH-P may be defined through the area corresponding to the panel hole HH of the electronic panel EP. In illustrated exemplary embodiments, the optical film hole HH-P may be defined in a location overlapping the panel hole HH of the electronic panel EP and may have a shape matching the shape of the panel hole HH, however, this is merely exemplary. A tolerance in position and size may exist between the optical film hole HH-P and the panel hole HH of the electronic panel EP due to manufacturing process errors.

The adhesive layer ADL may be disposed between the optical film POL and the window WM. The adhesive layer ADL may attach the optical film POL and the window WM. In a case where the optical film POL According to some exemplary embodiments, the color filter is formed in the electronic panel EP, and the adhesive layer ADL may substantially attach the electronic panel EP and the window WM. The adhesive layer ADL may include an optically clear adhesive, an optically clear resin, or a pressure sensitive adhesive, however, it should not be limited to a specific exemplary embodiment as long as it is optically clear.

A predetermined hole HH-A (hereinafter, referred to as an "adhesive layer hole") may be defined through the adhesive layer ADL. The adhesive layer hole HH-A may be formed along the panel hole HH of the electronic panel EP. In illustrated exemplary embodiments, the adhesive layer hole HH-A and the optical film hole HH-P are aligned along the panel hole HH of the electronic panel EP, however, this is merely exemplary. The adhesive layer hole HH-A and the optical film hole HH-P may not perfectly overlap with the panel hole HH of the electronic panel EP due to manufacturing process errors.

The protective layer PTL may be disposed under the electronic panel EP. The protective layer PTL may include a plurality of layers, and the protective layer PTL may include various layers to relive stress applied to the electronic panel EP when the electronic panel EP is folded or to protect the electronic panel EP from external impacts. For example, the protective layer PTL may include a cushion layer that has a foam shape to absorb the impacts on the electronic panel EP, a light blocking layer that blocks a light from the electronic panel EP, and a heat dissipation layer that dissipates heat generated from the electronic panel EP.

A predetermined hole HH-T (hereinafter, referred to as a "protective layer hole") may be defined through the protective layer PTL. The protective layer hole HH-T may be formed along the panel hole HH of the electronic panel EP. In illustrated exemplary embodiments, the protective layer hole HH-T, the adhesive layer hole HH-A, and the optical film hole HH-P are aligned to correspond to the panel hole HH of the electronic panel EP, however, this is merely exemplary. The protective layer hole HH-T, the adhesive layer hole HH-A, and the optical film hole HH-P may not perfectly overlap with the panel hole HH of the electronic panel due to process errors.

The electronic module EM may be disposed under the window WM. The electronic module EM may overlap the panel hole HH when viewed in a plane. The electronic module EM may receive the external input transmitted through the panel hole HH or may provide the output through the panel hole HH.

In the electronic module EM, a receiving part that receives the external input or an output part that provides the output may overlap the panel hole HH when viewed in a plane. According to some exemplary embodiments, the electronic module EM may be disposed to overlap the active area AA, and thus, the bezel area BZA may be prevented from increasing.

Referring to FIG. 3B, the electronic apparatus EA may include the electronic panel EP, a power supply module PS, a first electronic module EM1, and a second electronic module EM2. The electronic panel EP, the power supply module PS, the first electronic module EM1, and the second electronic module EM2 may be electrically connected to each other.

In FIG. 3B, a display unit DU and a sensing unit SU among the possible components of the electronic panel EP are shown as a representative example. The display unit DU may include a plurality of pixels and may display the image IM. The sensing unit SU may sense the external input applied to the window WM. The external input may include various types of external inputs, such as a portion of user's body who uses the electronic apparatus EA, light, heat, or pressure provided from the outside. In addition, the electronic apparatus EA may sense a proximity input as well as a touch input to the electronic apparatus EA. The sensing unit SU may be stacked on the display unit DU or may be inserted into the display unit DU to be integrally formed with the display unit DU.

The first electronic module EM1 and the second electronic module EM2 may include various functional modules to operate the electronic apparatus EA. The first electronic module EM1 may be mounted directly on a mother board electrically connected to the electronic panel EP or may be electrically connected to the mother board via a connector after being mounted on a separate substrate.

The first electronic module EM1 may include a control module CM, a wireless communication module TM, an image input module IIM, an audio input module AIM, a memory MM, and an external interface IF. Some modules among the modules may be electrically connected to the mother board through a flexible circuit board without being mounted on the mother board.

The control module CM may control an overall operation of the electronic apparatus EA. The control module CM may be, but not limited to, a microprocessor. For example, the control module CM may activate or deactivate the electronic panel EP. The control module CM may control other modules, such as the image input module IIM, the audio input module AIM, or the like, based on the touch signal provided from the electronic panel EP.

The wireless communication module TM may transmit/receive a wireless signal to/from other terminals using a Bluetooth or WiFi link. The wireless communication module TM may transmit/receive a voice signal using a general communication line. The wireless communication module TM may include a transmitter TM1 that modulates a signal to be transmitted and transmits the modulated signal and a receiver TM2 that demodulates the signal applied thereto.

The image input module IIM may process an image signal and may convert the image signal into image data that may be displayed through the electronic panel EP. The audio input module AIM may receive an external sound signal through a microphone in a record mode or a voice recognition mode and may convert the external sound signal to electrical voice data.

The external interface IF serves as an interface between the control module CM and external devices, such as an external charger, a wired/wireless data port, a card socket (e.g., a memory card and a subscriber identity module (SIM)/universal subscriber identity module (USIM) card), etc.

The second electronic module EM2 may include an audio output module AOM, a light emitting module LM, a light receiving module LRM, and a camera module CMM. The components may be mounted directly on the mother board, may be electrically connected to the electronic panel EP via a connector after being mounted on a separate substrate, or may be electrically connected to the first electronic module EM1.

The audio output module AOM may convert the sound data provided from the wireless communication module TM or the sound data stored in the memory MM and may output the converted sound data to the outside.

The light emitting module LM may generate light and may output light. The light emitting module LM may emit an infrared ray. The light emitting module LM may include an LED element. The light receiving module LRM may sense the infrared ray. The light receiving module LRM may be activated when the infrared ray having a predetermined level or higher is sensed. The light receiving module LRM may include a complementary metal oxide semiconductor (CMOS) sensor. The infrared ray generated by and output from the light emitting module LM may be reflected by an external object, e.g., a user's finger or face, and the reflected infrared ray may be incident into the light receiving module LRM. The camera module CMM may take an image of an external object.

The electronic module EM according to some exemplary embodiments may include at least one of the configurations of the first electronic module EM1 and the second electronic module EM2. For example, the electronic module EM may include at least one of a camera, a speaker, a light sensor, and a heat sensor. The electronic module EM may sense the external object through the panel hole HH and may provide a sound signal, such as voice, to the outside through the panel hole HH. In addition, the electronic module EM may include a plurality of configurations, and it should not be limited to a specific exemplary embodiment.

According to some exemplary embodiments, the electronic module EM may be assembled to overlap the transmission area TA when viewed in a plane. Thus, the increase of the bezel area BZA, which is caused when the electronic module EM is arranged in the bezel area BZA, may be prevented, and the aesthetics of the electronic apparatus EA may be improved.

Figure 4A:
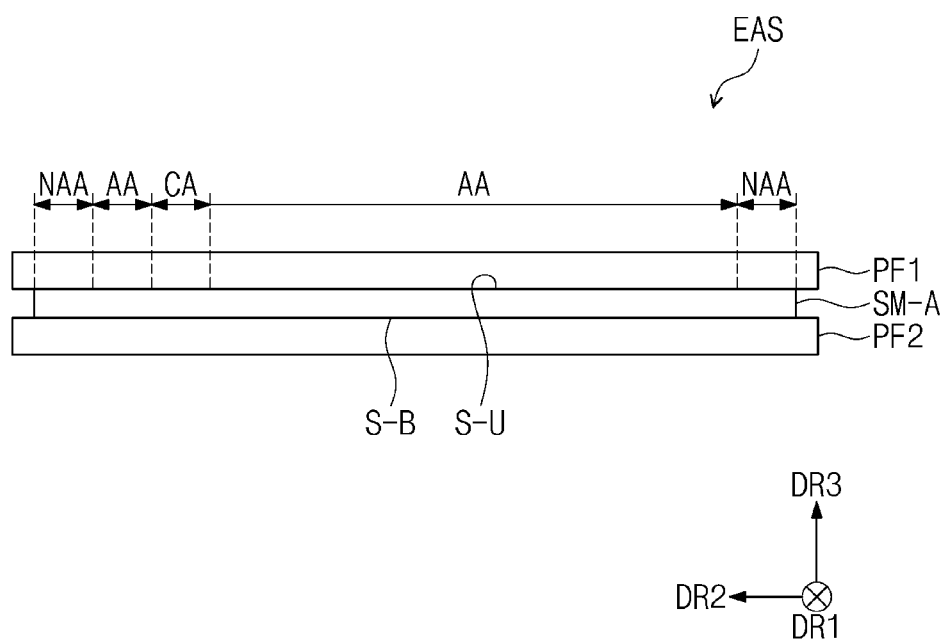
FIG. 4A is a cross-sectional view illustrating an exemplary embodiment of a method of manufacturing an electronic apparatus according to principles of the invention.
Figure 4B:
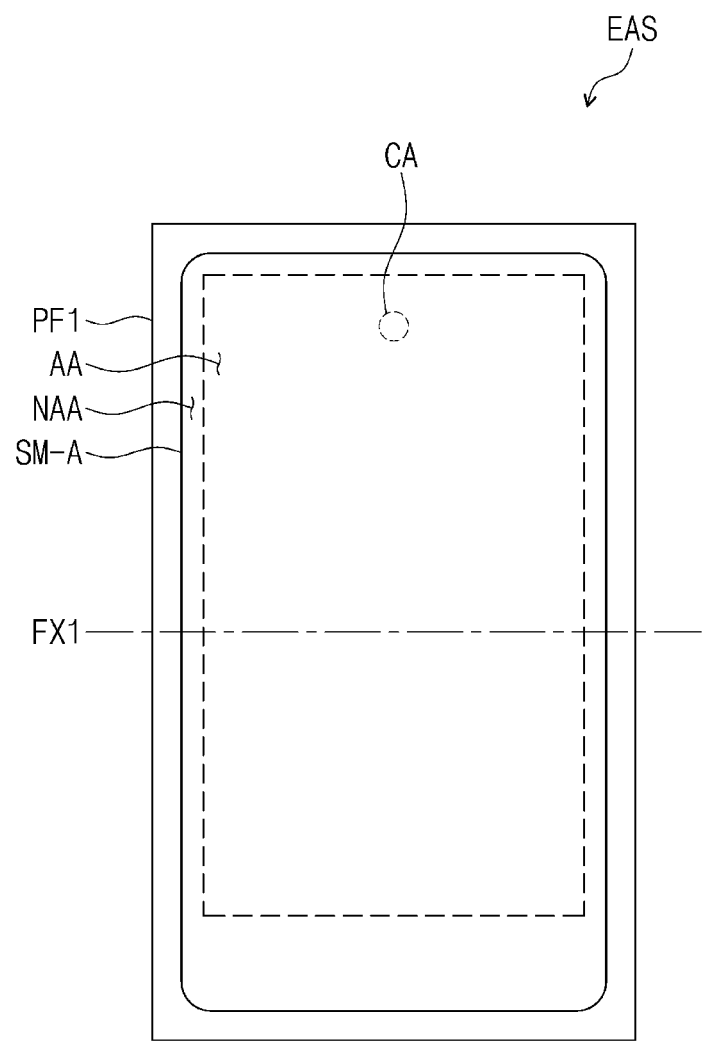
FIG. 4B is a plan view illustrating an exemplary embodiment of a method of manufacturing an electronic apparatus according to principles of the invention.
Figure 5A:
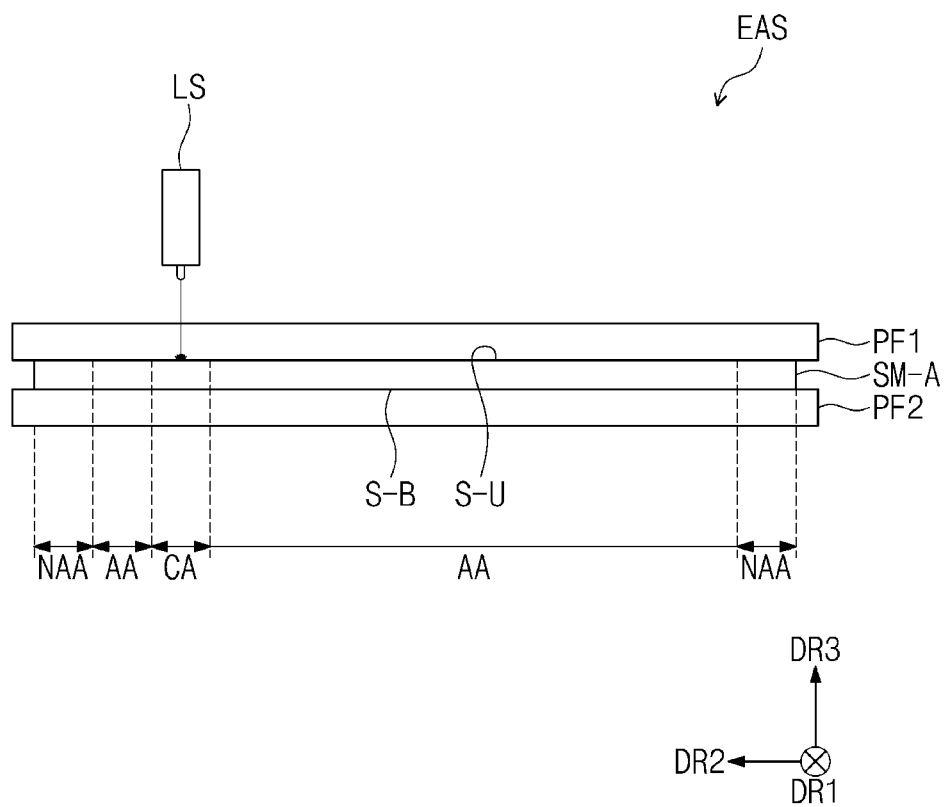
FIG. 5A is a cross-sectional view illustrating an exemplary embodiment of an unfinished set module constructed according to principles of the invention.
Figure 5B:
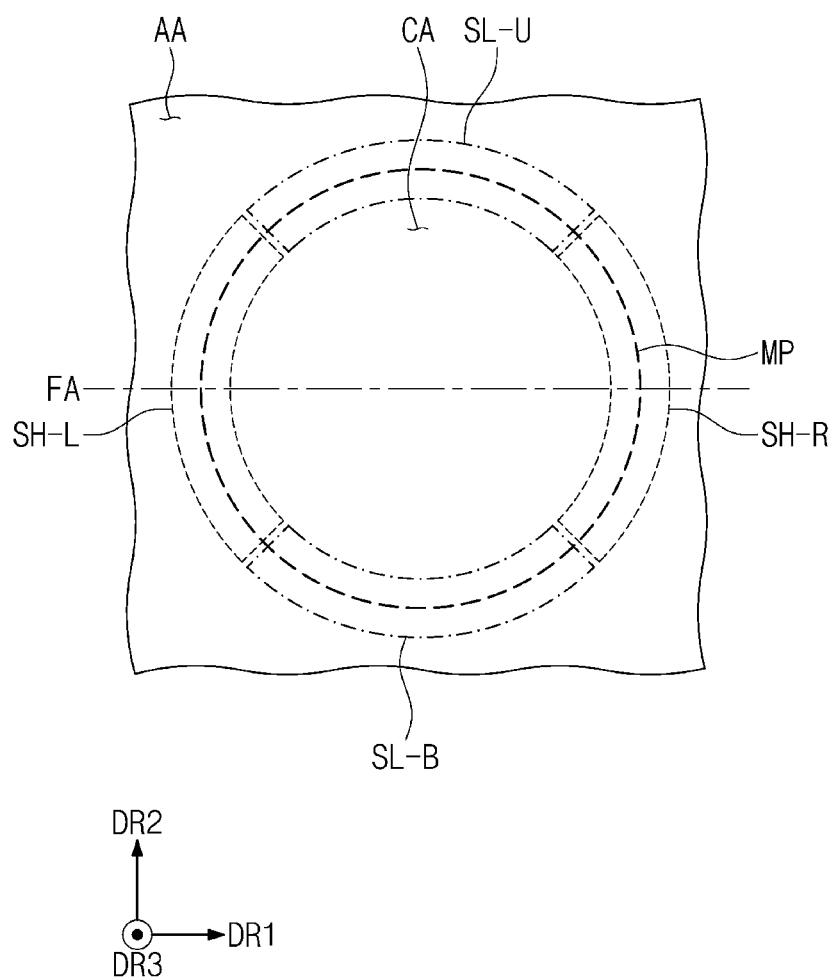
FIG. 5B is a plan view illustrating an enlarged view of a portion of area AA of the unfinished set module shown in FIG. 5A.
Figure 6A:
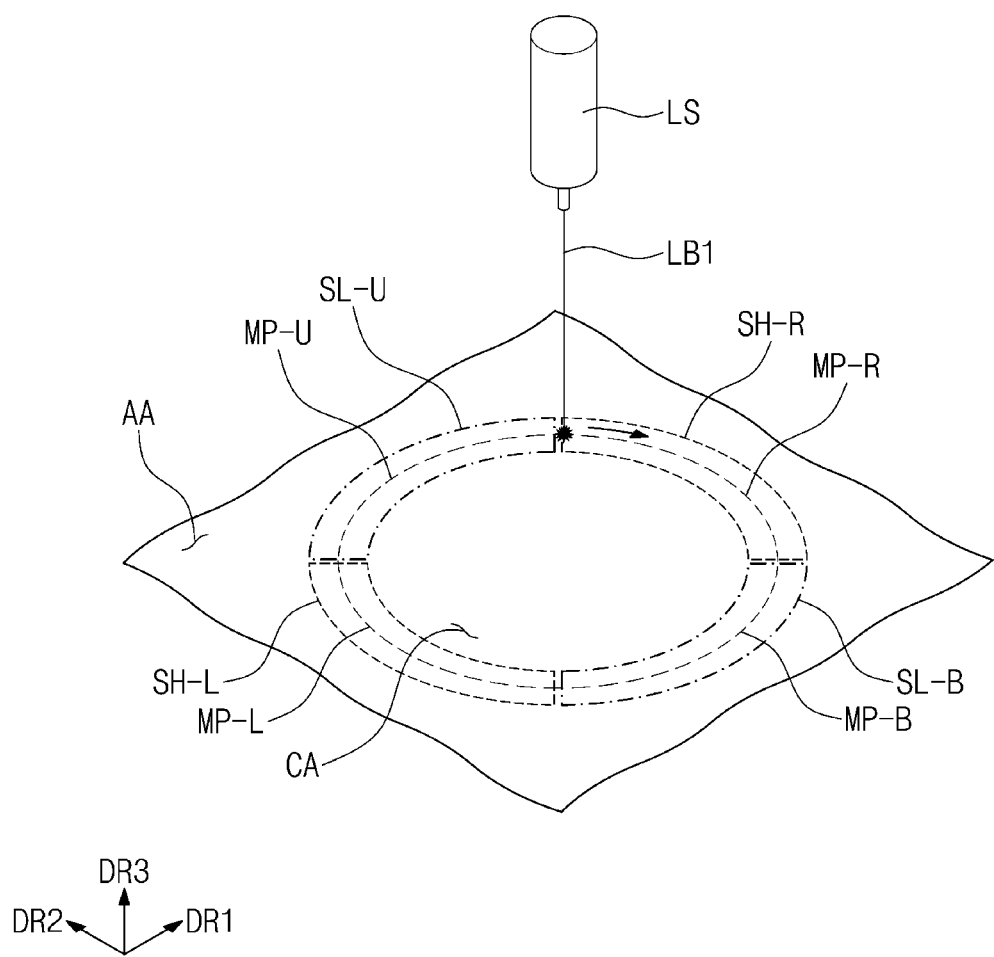
FIGS. 6A and 6B are perspective views showing irradiating a laser beam along a moving path in the portion of area AA shown in FIG. 5B.
Figure 6B:
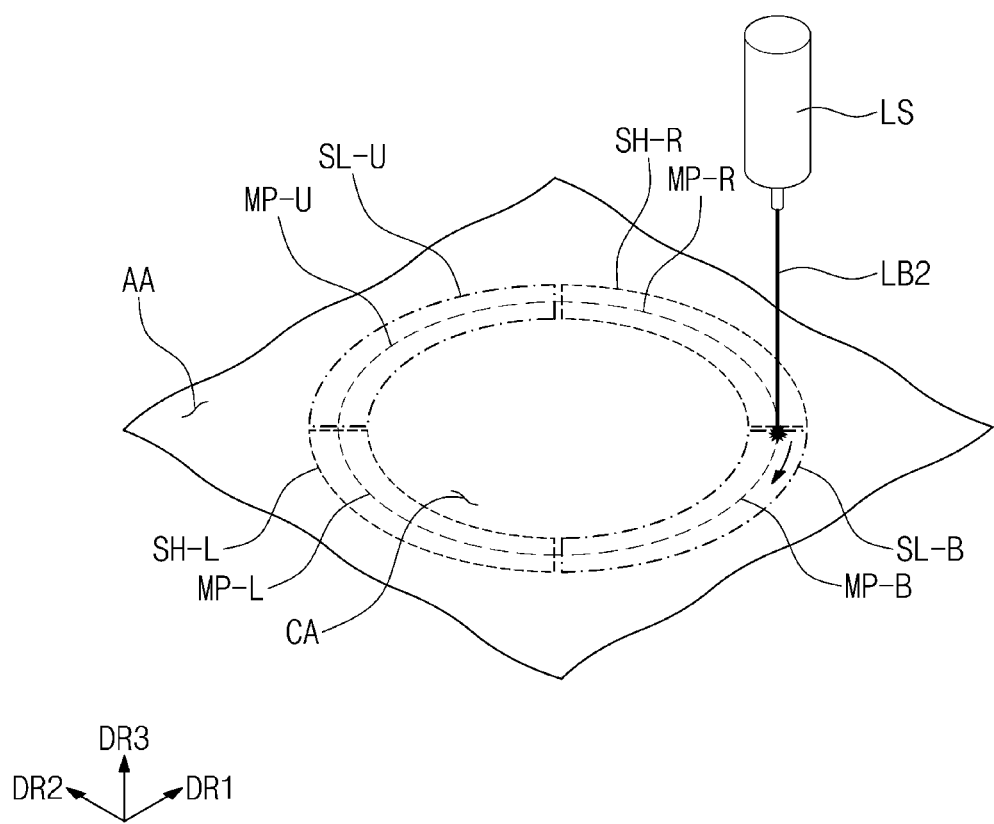
Figure 7:
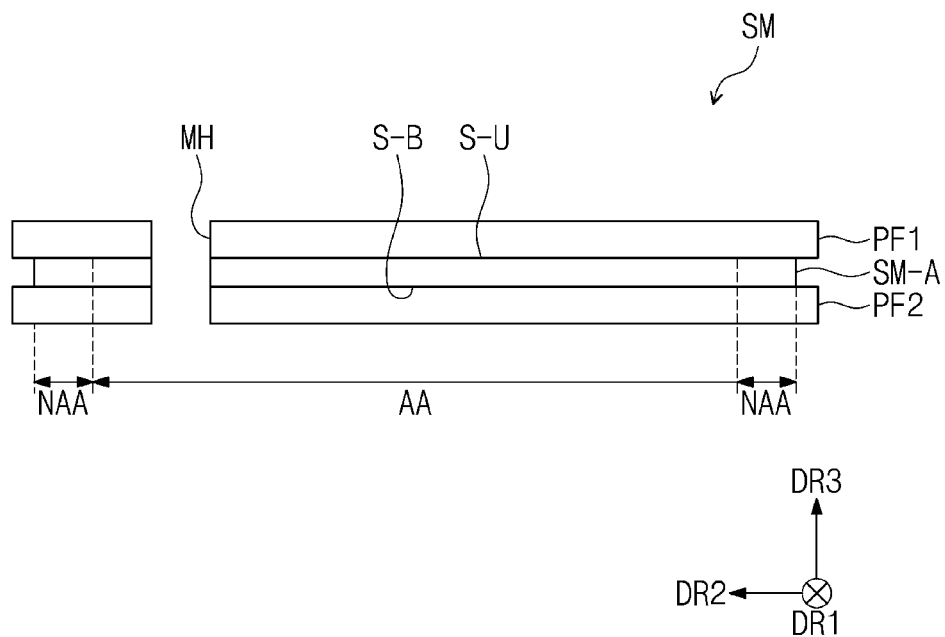
FIG. 7 is a cross-sectional view illustrating an exemplary embodiment of a set module constructed according to principles of the invention.

FIG. 4A is a cross-sectional view illustrating an exemplary embodiment of a method of manufacturing an electronic apparatus according to principles of the invention. FIG. 4B is a plan view illustrating an exemplary embodiment of a method of manufacturing an electronic apparatus according to principles of the invention. FIG. 5A is a cross-sectional view illustrating an exemplary embodiment of an unfinished set module constructed according to principles of the invention. FIG. 5B is a plan view illustrating an enlarged view of a portion of area AA of the unfinished set module shown in FIG. 5A. FIGS. 6A and 6B are perspective views showing irradiating a laser beam along a moving path in the portion of area AA shown in FIG. 5B. FIG. 7 is a cross-sectional view illustrating an exemplary embodiment of a set module constructed according to principles of the invention.

Hereinafter, the manufacturing method of the electronic apparatus according to some exemplary embodiments will be described with reference to FIGS. 4A to 7. In more detail, the manufacturing method of the electronic apparatus to form the holes HH-A, HH-P, HH, and HH-T, which overlap the electronic module EM, through the set module SM (refer to FIG. 3A) will be described. In FIGS. 4A to 7, the same/similar reference numerals denote the same/similar elements in FIGS. 1 to 3B, and thus, detailed descriptions of the same elements will be omitted to avoid redundancy.

The manufacturing method of the electronic apparatus according to illustrated exemplary embodiments may include providing a work substrate. The work substrate EAS may include an unfinished (preliminary) set module SM-A and protective films PF1 and PF2.

In illustrated exemplary embodiments, the preliminary set module SM-A may be defined as a module in a state in which the holes HH-A, HH-P, HH, and HH-T are not yet formed in components included in the set module SM described in FIG. 3A. Accordingly, the preliminary set module SM-A may include the electronic panel EP, the optical film POL, the adhesive layer ADL, and the protective layer PTL, which are respectively in states before the holes HH-A, HH-P, HH, and HH-T are formed. For the convenience of explanation, the circuit board DC will be omitted in the following drawings, and the process of forming the panel hole HH through the electronic panel EP will be mainly described.

Referring to FIGS. 4A and 4B, the preliminary set module SM-A includes the active area AA including a hole formation area CA and the peripheral area NAA defined adjacent to the active area AA. In addition, the preliminary set module SM-A includes an upper surface S-U and a rear surface S-B opposite to the upper surface S-U. The preliminary set module SM-A is foldable about an imaginary folding axis FX1 that extends in the first direction DR1.

FIG. 4B shows the hole formation area CA defined at an upper center of the active area AA, however, the location of the hole formation area CA should not be limited thereto or thereby. For example, the hole formation area CA may be defined as the area that overlaps the electronic module EM shown in FIG. 3A, and the shape and the number of the hole formation areas CA should not be particularly limited as long as the hole formation area CA is defined inside the active area AA.

The protective films PF1 and PF2 may be disposed on at least one of the upper surface S-U and the rear surface S-B of the preliminary set module SM-A. The protective films PF1 and PF2 may be attached to the preliminary set module SM-A by an adhesive layer.

The protective films PF1 and PF2 may protect the preliminary set module SM-A from external impacts generated when the preliminary set module SM-A is transported and assembled. The protective films PF1 and PF2 may prevent external moisture from entering the preliminary set module SM-A and may absorb the external impacts. In addition, the protective films PF1 and PF2 may prevent residues generated when the hole is formed through the preliminary set module SM-A from entering the preliminary set module SM-A.

The protective films PF1 and PF2 may protect the display module DM. The protective films PF1 and PF2 may provide an outer surface exposed to the outside and may provide an adhesive surface attached to an adhesive member. The protective films PF1 and PF2 may prevent external moisture from entering the display module DM and may absorb the external impacts.

The protective films PF1 and PF2 may include a plastic film as their base layer. The protective films PF1 and PF2 may include the plastic film containing one selected from the groups consisting of a polyethersulphone (PES), a polyacrylate (PAR), a polyether imide (PEI), a polyethylene naphthalate (PEN), a polyethylene terephthalate (PET), a polyphenylene sulfide (PPS), a polyarylate, polyimide (PI), a polycarbonate (PC), a poly(aryleneether sulfone), and combinations thereof.

The material for the protective films PF1 and PF2 should not be limited to plastic resins and may include an organic-inorganic composite material. The protective films PF1 and PF2 may include a porous organic layer and an inorganic material filled in pores of the organic layer. The protective films PF1 and PF2 may further include a functional layer formed in the plastic film. The functional layer may include a resin layer. The functional layer may be formed by a coating method. According to some exemplary embodiments, the protective films PF1 and PF2 may be omitted.

Referring to FIGS. 5A and 5B, a laser unit LS may irradiate a laser beam onto the upper surface S-U of the preliminary set module SM-A. The laser beam may be irradiated from a predetermined point defined inside the hole formation area CA defined through the active area AA of the preliminary set module SM-A or a predetermined point defined inside a path in the form of a moving path MP.

According to some exemplary embodiments, the boundary between the hole formation area CA and the active area AA may be defined as a path along which the laser beam is irradiated, i.e., the moving path MP of the laser beam. Accordingly, the laser beam may be irradiated along the moving path MP to remove the hole formation area CA of the preliminary set module SM-A. In illustrated exemplary embodiments, the laser beam may be a pulse laser generated from the laser unit LS.

As disclosed herein, the laser beam provided from the laser unit LS may rotate a plurality of times along the moving path MP. For instance, the laser beam may rotate along the moving path MP in a range between about one or more times and about one hundred or less times to remove the hole formation area CA.

The moving speed of the laser beam that moves along the moving path MP may be in a range between about 50 millimeter per second (mm/s) or greater and about 6,000 mm/s or less. The frequency of the laser beam may be in a range between about 100 kilohertz (kHz) or greater and about 20,000 kHz or less. The power of the laser beam may be in a range between about 0.5 watt (W) or greater and about 30 W or less.

The active area AA according to some exemplary embodiments may include first areas SH-L and SH-R and second areas SL-U and SL-B adjacent to the panel hole HH shown in FIG. 3A. The first areas SH-L and SH-R and the second areas SL-U and SL-B may be distinguished from each other by the intensity of stress generated when the electronic apparatus EA is repeatedly folded about one of the folding axes FX1 and FX2.

For example, the first areas SH-L and SH-R may be areas having relatively greater stress than that applied to the second areas SL-U and SL-B due to repeated folding operations when the electronic apparatus EA is folded by the user.

The first areas SH-L and SH-R may be spaced apart from each other along an imaginary line FA. The second areas SL-U and SL-B may be disposed between the first areas SH-L and SH-R. The imaginary line FA may extend in the first direction DR1 that is parallel to the extension direction of the folding axes FX1 and FX2.

Accordingly, when the laser beam is irradiated onto the active area AA of the preliminary set module SM-A to remove the hole formation area CA and the laser beam is irradiated onto the first areas SH-L and SH-R and the second areas SL-U and SL-B at the same energy density, components of the electronic panel EP overlapping the first areas SH-L and SH-R to which the relatively greater stress is applied may be damaged.

According to principles of the invention, because the areas to which different stresses caused by the repeated folding operation are applied are predetermined and the laser beam used to remove the hole formation area CA is irradiated at different energy densities according to the predetermined areas, the components disposed in the area to which the relatively greater stress is applied may be protected. Therefore, electronic apparatus made by manufacturing methods according to the principles and exemplary embodiments of the invention have improved reliability.

For example, referring to FIGS. 6A and 6B, the manufacturing method of the electronic apparatus may include providing the preliminary set module that includes the active area AA including the hole formation area CA and the peripheral area NAA and is folded about the imaginary folding axis FX1.

The manufacturing method of the electronic apparatus may include irradiating the laser beam along the moving path MP defined along the boundary between the hole formation area CA and the active area AA.

The moving path MP may include first paths MP-L and MP-R overlapping the first areas SH-L and SH-R and second paths MP-U and MP-B overlapping the second areas SL-U and SL-B.

The manufacturing method of the electronic apparatus may include removing the hole formation area CA to form the set module SM through which a module hole MH shown in FIG. 7 is defined. The module hole MH may be defined by aligning the adhesive layer hole HH-A, the optical film hole HH-P, the panel hole HH, and the protective layer hole HH-T shown in FIG. 3A.

The manufacturing method of the electronic apparatus may further include forming the module hole MH through the preliminary set module SM-A to form the set module SM and removing the protective films PF1 and PF2 attached to at least one of the upper surface S-U and the rear surface S-B of the set module SM.

According to some exemplary embodiments, a laser beam LB1 irradiated to the first paths MP-L and MP-R may have a first energy density different from a second energy density of a laser beam LB2 irradiated to the second paths MP-U and MP-B. For example, the first energy density may be smaller than the second energy density. Accordingly, the first energy density of the laser beam LB1 irradiated to the first areas SH-L and SH-R may be smaller than the second energy density of the laser beam LB2 irradiated to the second areas SL-U and SL-B.

As used herein, the expression "the energy density of the laser beam is small" means that the moving speed of the laser beam is relatively fast, the frequency of the laser beam is relatively high, and the power of the laser beam is relatively low.

According to some exemplary embodiments, as the first energy density of the laser beam LB1 irradiated to the first paths MP-L and MP-R is smaller than the second energy density of the laser beam LB2 irradiated to the second paths MP-U and MP-B, the components of the electronic panel EP overlapping the first areas SH-L and SH-R to which the relatively greater stress is applied may be protected. Thus, the manufacturing method according to the principles and exemplary embodiments of the invention produces electronic apparatus having improved reliability.

Figure 8:
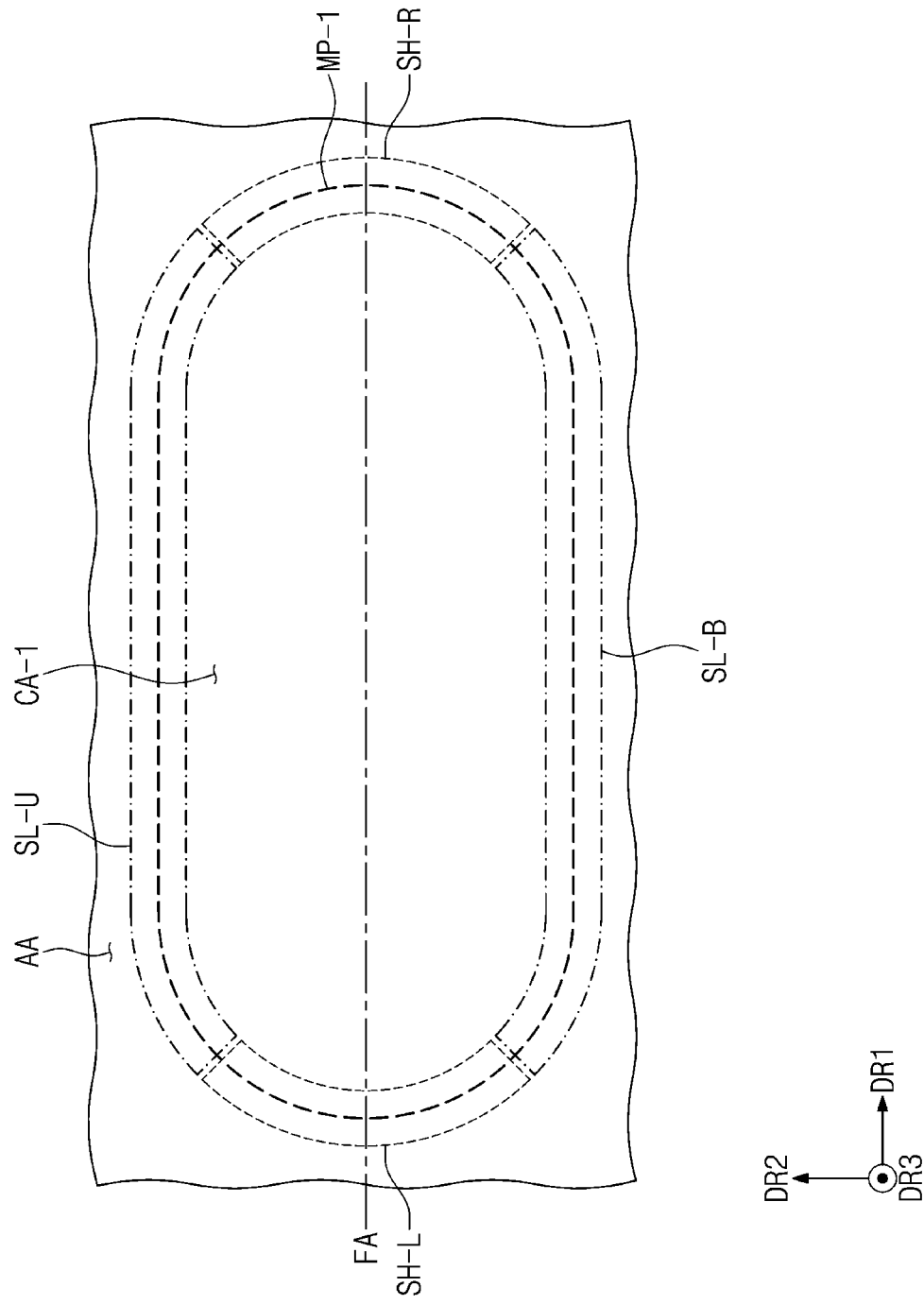
FIG. 8 is a plan view illustrating an exemplary embodiment of an unfinished set module constructed according to principles of the invention.

FIG. 8 is a plan view illustrating an exemplary embodiment of an unfinished set module constructed according to principles of the invention. In FIG. 8, the same/similar reference numerals denote the same/similar elements in FIG. 5B, and thus, detailed descriptions of the same/similar elements will be omitted to avoid redundancy.

Referring to FIG. 8, a hole formation area CA-1 may have a generally oval shape. Accordingly, a moving path MP-1 along which a laser beam moves may have a generally oval shape. According to illustrated exemplary embodiment, a preliminary set module may include first areas SH-L and SH-R and second areas SL-U and SL-B distinguished from each other according to the stress applied by the folding operation.

The laser beam having a relatively smaller energy density than that of the laser beam applied to a moving path MP-1 overlapping the second areas SL-U and SL-B may be irradiated to a moving path MP-1 overlapping the first areas SH-L and SH-R to which the relatively greater stress is applied.

However, the exemplary embodiments should not be limited thereto or thereby, and the hole formation area CA-1 may have one of a generally circular shape, a generally oval shape, and a generally polygonal shape. Accordingly, the laser beam may be irradiated along the shape corresponding to the shape of the hole formation area CA-1, however, the exemplary embodiments should not be limited thereto or thereby.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A method of manufacturing an electronic apparatus, comprising the steps of:
    providing an unfinished set module for a display panel having an active area and a peripheral area adjacent to the active area and being foldable about a foldable axis extending in one direction, the active area including a hole formation area;
    selectively irradiating a laser beam along a path defined along a boundary between the hole formation area and the active area, the path including first paths spaced apart from each other in a direction substantially parallel to the foldable axis and second paths disposed between the first paths, at a first energy density and at a second energy density different from the first energy density, wherein the laser beam is irradiated at the first energy density along the first paths and at the second energy density along the second paths; and
    forming a set module having a hole by removing the hole formation area from the unfinished set module.

2. The method of claim 1, wherein the first energy density is less than the second energy density.

3. The method of claim 1, wherein the hole formation area has a generally circular shape, a generally oval shape, or a generally polygonal shape.

4. The method of claim 1, wherein the laser beam is rotated along the path including a moving path in a range of about one time or more and about hundred times or less.

5. The method of claim 1, wherein the hole formation area is provided in plural.

6. The method of claim 1, wherein the laser beam is generated by a pulse laser.

7. The method of claim 1, wherein the step of selectively irradiating a laser beam comprising moving the laser beam along the first paths at a first speed slower than a speed at which the laser beam is moved along the second paths.

8. The method of claim 1, wherein the laser beam moves in a range between about 50 mm/s or greater and about 6,000 mm/s or less.

9. The method of claim 1, wherein the laser beam has a power in a range between about 0.5 W or greater and about 30 W or less.

10. The method of claim 1, wherein the laser beam has a frequency in a range about 100 kHz or greater and about 20,000 kHz or less.

11. A method of manufacturing an electronic apparatus, comprising:
    providing an unfinished set module for a display panel having an active area and a peripheral area adjacent to the active area and being foldable about a foldable axis extending in one direction, the active area including first areas and second areas that are subject to different stresses during folding;
    irradiating a laser beam to the active area; and
    forming a set module in which a module hole is defined through the unfinished set module by irradiating to the first areas a laser beam at a first energy density and irradiating a laser beam to the second areas at a second energy density greater than the first energy density.

12. The method of claim 11, wherein the first areas are spaced apart from each other in a direction substantially parallel to the foldable axis and the second areas are disposed between the first areas.

13. The method of claim 11, wherein the laser beam has a generally circular shape, a generally oval shape, or a generally polygonal shape.

14. The method of claim 11, wherein the laser beam is rotated along the path in a range of about one time or more and about one hundred times or less.

15. The method of claim 11, wherein the module hole is provided in plural.

16. The method of claim 11, wherein the laser beam is generated by a pulse laser.

17. The method of claim 11, the step of forming the set module comprises moving the laser beam along first paths at a first speed slower than a speed at which the laser beam is moved along second paths.

18. The method of claim 11, wherein the laser beam moves in a range between about 50 mm/s or greater and about 6,000 mm/s or less.

19. The method of claim 11, wherein the laser beam has a power in a range about 0.5 W or greater and about 30 W or less.

20. The method of claim 11, wherein the laser beam has a frequency in a range about 100 kHz or greater and about 20,000 kHz or less.

\* \* \* \* \*